(12) United States Patent
Hong

(10) Patent No.: US 8,802,523 B2
(45) Date of Patent: Aug. 12, 2014

(54) CMOS DEVICE AND FABRICATION METHOD

(71) Applicant: Zhongshan Hong, Shanghai (CN)

(72) Inventor: Zhongshan Hong, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 73 days.

(21) Appl. No.: 13/675,216

(22) Filed: Nov. 13, 2012

(65) Prior Publication Data
US 2014/0001474 A1    Jan. 2, 2014

(30) Foreign Application Priority Data
Jul. 2, 2012 (CN) ............. 2012-1-0226016

(51) Int. Cl.
*H01L 21/8238* (2006.01)
*H01L 27/092* (2006.01)
(52) U.S. Cl.
CPC .......... *H01L 21/8238* (2013.01); *H01L 27/092* (2013.01)
USPC ........... 438/199; 438/595; 438/622; 438/586; 438/287; 438/299

(58) Field of Classification Search
CPC ... H01L 21/8238; H01L 27/092; H01L 29/78; H01L 29/66477; H01L 29/66545
USPC .......... 438/199, 595, 622, 586, 287, 299, 527
See application file for complete search history.

(56) References Cited

U.S. PATENT DOCUMENTS

2013/0244416 A1*  9/2013  Ng et al. ............. 438/595
2014/0124845 A1*  5/2014  Cheng et al. ........... 257/310

\* cited by examiner

*Primary Examiner* — Cathy N Lam
(74) *Attorney, Agent, or Firm* — Anova Law Group, PLLC

(57) ABSTRACT

Various embodiments provide complementary metal-oxide-semiconductor (CMOS) devices and fabrication methods. An exemplary CMOS device can be formed by providing a first dummy gate over a semiconductor substrate in a first region, providing a second dummy gate over the semiconductor substrate in a second region, and amorphizing a surface portion of the first dummy gate to form a first amorphous silicon layer. The first amorphous silicon layer can be used to protect the first dummy gate in the first region, when a second opening is formed in the second region by wet etching at least the second dummy gate. A second metal gate can then be formed in the second opening, followed by removing the first amorphous silicon layer and at least the first dummy gate to form a first opening in the first region. A first metal gate can be formed in the first opening.

16 Claims, 6 Drawing Sheets

CMOS DEVICE AND FABRICATION METHOD

CROSS-REFERENCES TO RELATED APPLICATIONS

This application claims priority to Chinese Patent Application No. CN201210226016.5, filed on Jul. 2, 2012, the entire contents of which are incorporated herein by reference.

FIELD OF THE DISCLOSURE

The present disclosure relates to the field of semiconductor technology and, more particularly, relates to CMOS devices and methods for fabricating the CMOS devices.

BACKGROUND

Complementary metal-oxide-semiconductor (CMOS) devices have become basic devices in integrated circuit (IC) chips. A CMOS device generally includes a p-type metal oxide semiconductor (PMOS) transistor and an n-type metal oxide semiconductor (NMOS) transistor. With development of semiconductor manufacturing technology and for achieving high degree of integration, the CMOS devices are downsized. Consequently, when the CMOS devices are downsized to a certain point, gate length may reach its limitation, which may result in short channel effect. To control the short channel effect and to increase the gate capacitance, high-k dielectric materials have been used to replace conventional low-k silicon oxide. Additionally, metal gate such as aluminum is often used to replace polysilicon gate.

A work function layer may be formed on the gate dielectric layer to adjust threshold voltage of the PMOS and NMOS transistors. The work function layer in a PMOS transistor may be different from the work function layer in an NMOS transistor. Existing methods of forming CMOS devices may include: forming dummy gate structures in regions for forming PMOS and NMOS transistors; removing the dummy gate structure in one of the regions after forming source/drain regions by using the dummy gate structures as a mask; sequentially forming a gate dielectric layer, a work function layer, and a gate electrode layer in this region; and then removing the dummy gate structure in the other region followed by sequentially forming a gate dielectric layer, a work function layer, and a gate electrode layer in the region. Thus, existing methods of forming CMOS devices may include multiple repeating steps of chemical mechanical planarization (CMP) and etching steps, which often leads to errors in dimensions. The resulting CMOS device may operate unstably.

There is a need for processes to provide CMOS devices with improved device performance.

BRIEF SUMMARY OF THE DISCLOSURE

According to various embodiments, there is provided a method for forming a CMOS device. In this method, a semiconductor substrate can be provided to include a first region and a second region. A first dummy gate structure including a first dummy gate can be provided or formed over the semiconductor substrate in the first region. A second dummy gate structure including a second dummy gate can be provided or formed over the semiconductor substrate in the second region. A surface portion of the first dummy gate can be amorphized to form a first amorphous silicon layer on the first dummy gate. An interlayer dielectric layer can be formed on the semiconductor substrate, and the first amorphous silicon layer and the second dummy gate are exposed. The second dummy gate can be removed to form a second opening by wet etching, while the first amorphous silicon layer can protect the underlying first dummy gate without forming a photoresist protective layer on the first dummy gate. A second metal gate can be formed in the second opening. The first amorphous silicon layer and the first dummy gate can be removed to form a first opening. A first metal gate can be formed in the first opening.

According to various embodiments, there is also provided a CMOS device. The CMOS device can include a semiconductor substrate, a first metal gate disposed over a first region of the semiconductor substrate, and a second metal gate disposed over a second region of the semiconductor substrate. The first region further includes a dislocation-containing single crystalline silicon layer in the semiconductor substrate corresponding to a source region and a drain region. The CMOS device can be formed by providing a first dummy gate structure including a first dummy gate over the semiconductor substrate in the first region, providing a second dummy gate structure including a second dummy gate over the semiconductor substrate in the second region, amorphizing a surface portion of the first dummy gate to form a first amorphous silicon layer on the first dummy gate, forming an interlayer dielectric layer on the semiconductor substrate with the first amorphous silicon layer and the second dummy gate exposed, wet etching the second dummy gate to form a second opening, while the first amorphous silicon layer can protect the underlying first dummy gate without forming a photoresist protective layer on the first dummy gate, forming the second metal gate in the second opening, removing the first amorphous silicon layer and the first dummy gate to form a first opening, and forming the first metal gate in the first opening.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Various embodiments provide CMOS devices and fabrication methods. In one embodiment, the CMOS device can include metal gates with dislocation stress. For example, an NMOS dislocation process can be integrated with the removal process of the NMOS/PMOS dummy gates. In another embodiment, a first amorphous silicon layer can be formed by amorphizing a surface portion of the dummy gate in the NMOS region (or PMOS region), without forming a photoresist layer to cover the NMOS region (or PMOS region), when the dummy gate structure in the PMOS region (or NMOS region) is being processed, e.g., removed. Conventionally-used photolithographic process can be eliminated. In addition, less repeating steps of planarization and etching steps may be used to effectively improve operational stability of CMOS device.

Figure 1:
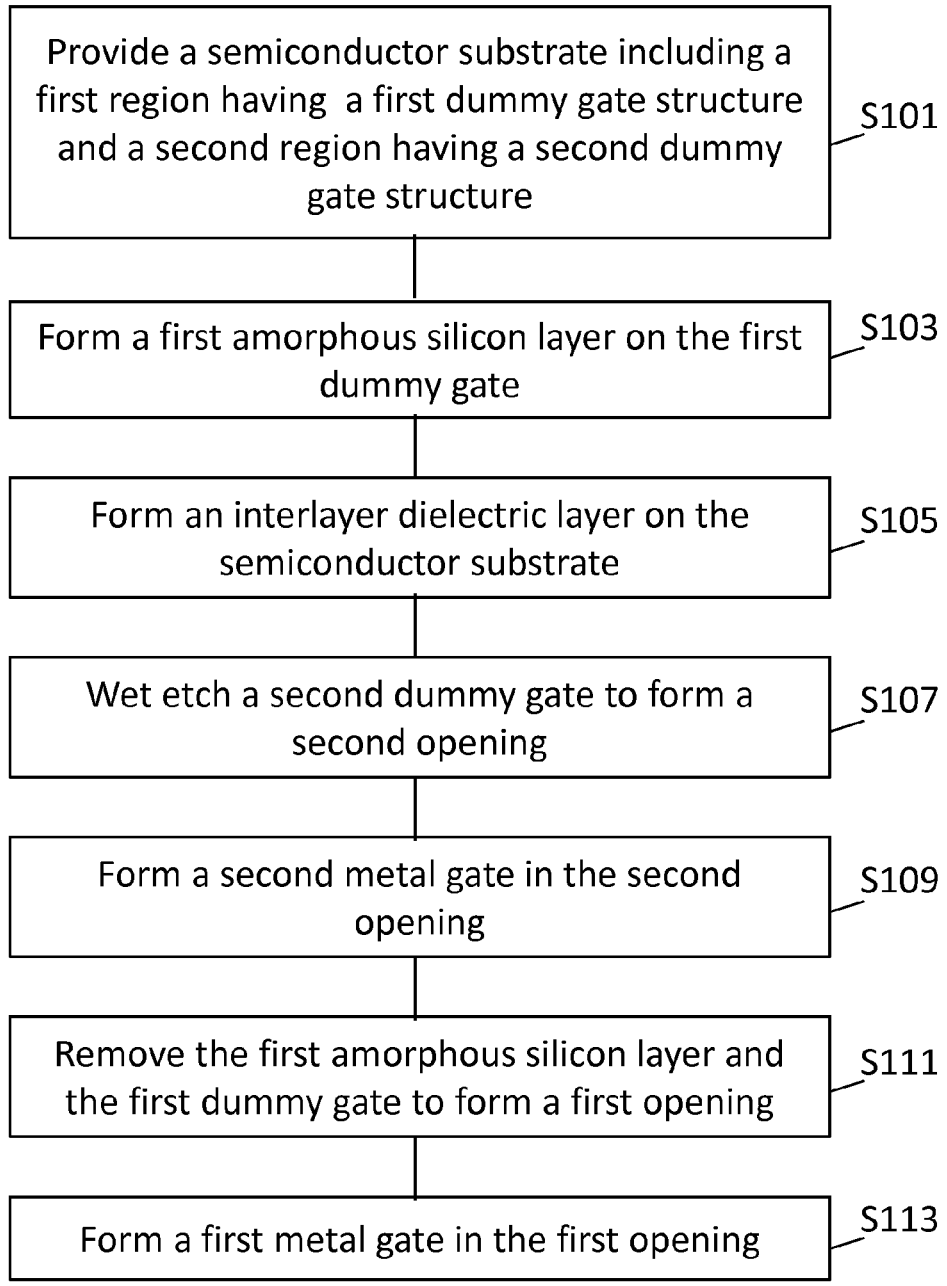
FIG. 1 depicts an exemplary method for forming a CMOS device in accordance with various disclosed embodiments.

FIG. 1 depicts an exemplary method of forming a CMOS device in accordance with various disclosed embodiments. FIGS. 2-11 depict cross-sectional views of the CMOS device at various stages during its formation as depicted in FIG. 1.

Figure 2:
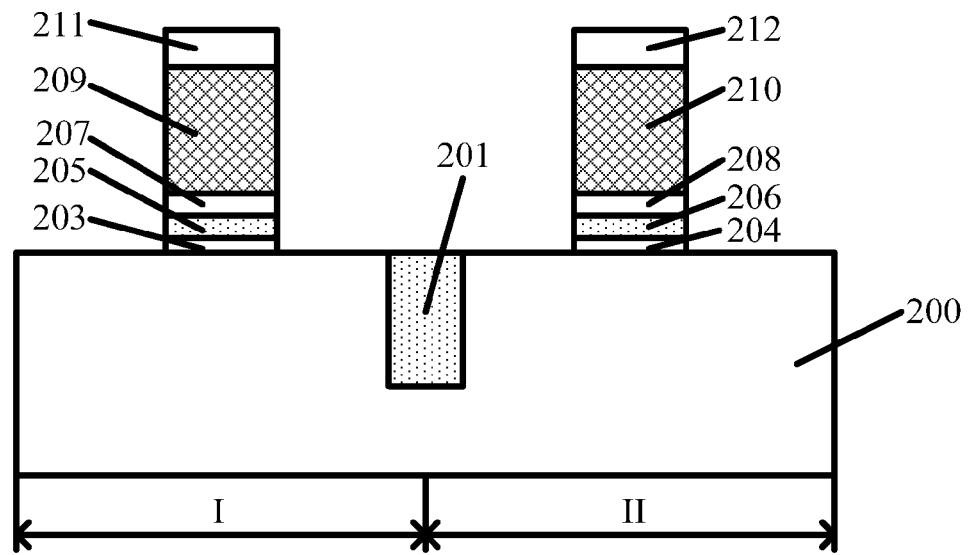
FIGS. 2-11 depict cross-sectional views of the CMOS device at various stages during its formation as depicted in FIG. 1 in accordance with various disclosed embodiments.

At step S101 of FIG. 1 and referring to FIG. 2, a semiconductor substrate 200 can be provided. The semiconductor substrate 200 can include a first region I including a first dummy gate structure and a second region II including a second dummy gate structure. In certain embodiments, the first region I can be used to form an NMOS transistor (or a PMOS transistor), while the second region II can be used to form a PMOS transistor (or an NMOS transistor).

For illustration purposes, various embodiments are described herein with reference to a manufacturing process for forming a CMOS device having the first region I for forming an NMOS transistor (e.g., having p-type ions or impurities doped within an associated region in the semiconductor substrate 200), and the second region II for forming a PMOS transistor (e.g., having n-type ions or impurities doped within an associated region in the semiconductor substrate 200). Alternatively, the first region I can be used to form a PMOS transistor, while the second region II can be used to form an NMOS transistor, without any limitation. In addition, the exemplary CMOS device may be fabricated by forming a PMOS transistor prior to forming an NMOS transistor. Alternatively, the PMOS transistor can be formed following formation of the NMOS transistor.

Referring back to FIG. 2, the semiconductor substrate 200 can provide a working platform and can be made of any appropriate semiconductor material including, but not limited to, silicon (Si), silicon germanium (SiGe), silicon carbide (SiC), silicon on insulator (SOI), and/or a Group III-V substrate, such as, for example, gallium arsenide (GaAs), indium phosphide (InP), and/or gallium nitride (GaN).

An isolation structure 201 can be formed in the semiconductor substrate 200 between the first region I and the second region II. The isolation structure 201 can include a shallow trench isolation structure, or any other isolation structures.

In the first region I, the first dummy gate structure can include a first interface layer 203, a first high-k dielectric layer 205, a first work function metal layer 207, a first dummy gate 209, and/or a first hard mask layer 211. The first interface layer 203 can be formed over the semiconductor substrate 200. The first high-k dielectric layer 205 can be formed over the first interface layer 203. The first work function metal layer 207 can be formed over the high-k dielectric layer 205. The first dummy gate 209 can be formed over the first work function metal layer 207. The first hard mask layer 211 can be formed over the first dummy gate 209.

In the second region II, the second dummy gate structure can include a second interface layer 204, a second high-k dielectric layer 206, a second work function metal layer 208, a second dummy gate 210, and/or a second hard mask layer 212. The second interface layer 204 can be formed over the semiconductor substrate 200. The second high-k dielectric layer 206 can be formed over the second interface layer 204. The second work function metal layer 208 can be formed over the second high-k dielectric layer 206. The second dummy gate 210 can be formed over the second work function metal layer 208. The second hard mask layer 212 can be formed over the second dummy gate 210.

The first interface layer 203 can be used to reduce a first interface resistance between the semiconductor substrate 200 and the subsequently-formed first high-k dielectric layer 205.

Likewise, the second interface layer 204 can be used to reduce a second interface resistance between the semiconductor substrate 200 and the subsequently-formed second high-k dielectric layer 206.

The first interface layer 203 and the second interface layer 204 can be formed using the same material and/or in the same process. For example, the interface layers 203 and 204 can be made of a material including silicon oxide or other suitable materials. The interface layers 203 and 204 can be formed by, for example, first forming a corresponding interface film covering the semiconductor substrate 200; and then etching the interface film to form the interface layer 203 and the interface layer 204 on surface of the semiconductor substrate 200 in the same process.

The first high-k dielectric layer 205 over the first interface layer 203 can be used to isolate the semiconductor substrate 200 from the subsequently-formed first metal gate. Likewise, the second high-k dielectric layer 206 over the second interface layer 204 can be used to isolate the semiconductor substrate 200 from the subsequently-formed second metal gate.

The first high-k dielectric layer 205 and the second high-k dielectric layer 206 can be made of the same or different materials. Such materials may include, but not be limited to $HfO_2$, HfSiO, HfSiNO, and/or $ZrO_2$. In certain embodiments, the first high-k dielectric layer 205 and the second high-k dielectric layer 206 can be made of the same material(s) to simplify the formation process. For example, the first high-k dielectric layer 205 and the second high-k dielectric layer 206 can be formed by etching a corresponding high-k dielectric film that covers the interface film as described above during formation of the interface layers 203 and 204. Alternatively, the high-k dielectric layers 205 and 206 can be formed by etching a corresponding high-k dielectric film that covers the first interface layer 203 and the second interface layer 204 after their formation.

The first work function metal layer 207 over the first high-k dielectric layer 205 can be used to adjust work function of the transistor to be formed in the first region I. The second work function metal layer 208 over the second high-k dielectric layer 206 can be used to adjust work function of the transistor to be formed in the second region II.

The first work function metal layer 207 can be formed by first forming a corresponding first functional thin film over the semiconductor substrate 200 in the first region I and then etching the first functional thin film to form the first work function metal layer 207. For example, the first functional thin film can be formed to cover the high-k dielectric thin film prior to forming the first high-k dielectric layer 205, followed by an etching process to remove a portion of the first functional thin film and/or a portion of the high-k dielectric thin film to form the first high-k dielectric layer 205. Alternatively, the first functional thin film can be formed to cover the formed first high-k dielectric layer 205, followed by an etching process. Likewise, the second work function metal layer 208 can be formed by etching a second functional thin film formed in the second region II that covers the second high-k dielectric thin film prior to forming the second high-k dielectric layer 206 or that covers the formed second high-k dielectric layer 206.

In certain embodiments, the first work function metal layer 207 and/or the second work function metal layer 208 can be made of a material including one or more of titanium nitride, tantalum, tantalum nitride, titanium aluminum, titanium, cobalt, nickel, and any possible combinations thereof. The first work function metal layer 207 and the second work function metal layer 208 can have different functions for respectively forming the NMOS and PMOS transistors. In this case, the first work function metal layer 207 and the second work function metal layer 208 can be made of different materials.

The first dummy gate 209 can be formed over the first work function metal layer 207. The first dummy gate 209 can define a corresponding position of a first metal gate to be formed. Likewise, the second dummy gate 210 can be formed over the second work function metal layer 207. The second dummy gate 210 can define a corresponding position of a second metal gate to be formed.

The first and second dummy gates 209 and 210 can be subsequently removed. In certain embodiments, to simplify the fabrication process, the first and second dummy gates 209 and 210 can be made of polysilicon and can be formed by etching a corresponding polysilicon film. The polysilicon film may be formed over the high-k dielectric film or over the high-k dielectric layers 207 and 208.

In some embodiments, a barrier layer, e.g., an effective diffusion barrier, may be formed over the first high-k dielectric layer 205 (and/or the second high-k dielectric layer 206). The barrier layer (not shown) may include metal nitrides such as titanium nitride (TiN) and/or tantalum nitride (TaN).

In other embodiments, the interface layers 203 and 204, the high-k dielectric layers 205 and 206, the functional layers 207 and 208, and/or the dummy gates 209 and 210 can be formed sequentially using separate etching processes. In still other embodiments, the interface layers 203 and 204, the high-k dielectric layers 205 and 206, the functional layers 207 and 208, and/or the dummy gates 209 and 210 can be formed in a single process by first overlaying corresponding thin films on the semiconductor substrate 200 and then etching all of the overlaid thin films in a single etching process.

During the etching process, a hard mask can be used. For example, as shown in FIG. 2, a first hard mask layer 211 and a second hard mask layer 212 can be used during formation of the interface layers 203 and 204, the high-k dielectric layers 205 and 206, the functional layers 207 and 208, and/or the dummy gates 209 and 210. The first and second hard mask layers 211 and 212 can be made of the same or different materials including, for example, silicon nitride oxide, silicon oxide, silicon carbonitride (SiCN), and/or silicon nitride. In a certain embodiment, the first and second hard mask layers 211 and 212 can be made of the same material including, e.g., silicon nitride.

It should be noted that, the device shown in FIG. 2 is for illustration purposes only. One or more layers of the device shown in FIG. 2 can be omitted and/or altered, and additional layers can be added. In one example, the interface layers 203 and 204 and/or the functional layers 207 and 208 may be omitted from the disclosed CMOS device. In another example, instead of using the high-k dielectric layers 205 and 206, low-k dielectric layers, e.g., silicon oxide, may be used. In various embodiments, the dielectric layers may be subsequently removed when removing a corresponding dummy gate.

Figure 3:
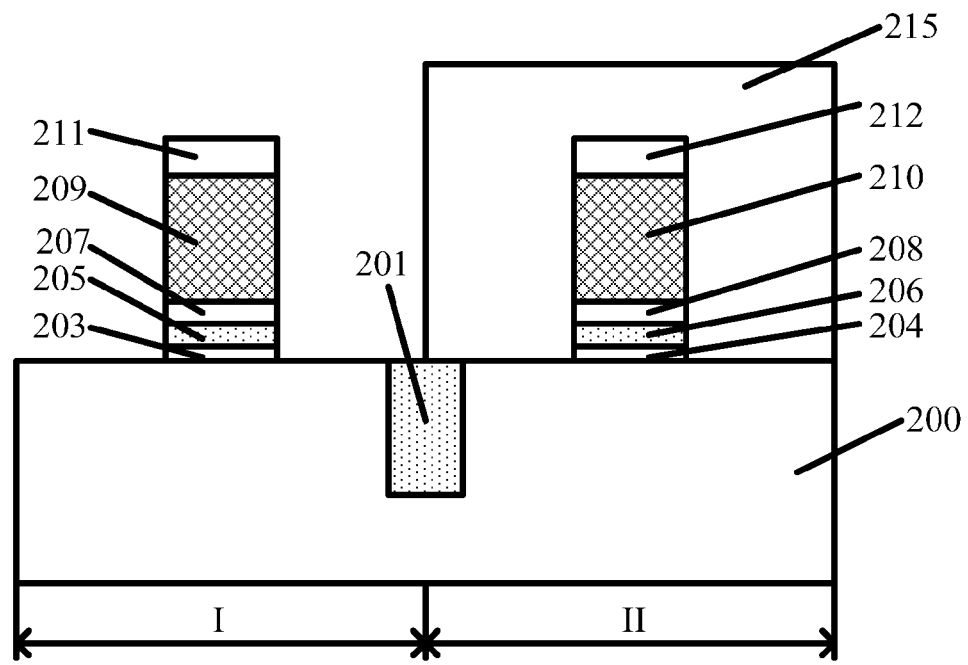

Referring to FIG. 3, a protective layer 215 can be formed over the second hard mask layer 212 and over a portion of the semiconductor substrate 200 that is associated with the second region II. The second hard mask layer 212 and the portion of the semiconductor substrate 200 associated with the second region II can thus be protected, when the CMOS device is being processed in the first region I. After such process, the protective layer 215 can be removed. In various embodiments, the protective layer 215 can be made by a standard photolithographic process using a photoresist material.

Figure 4:
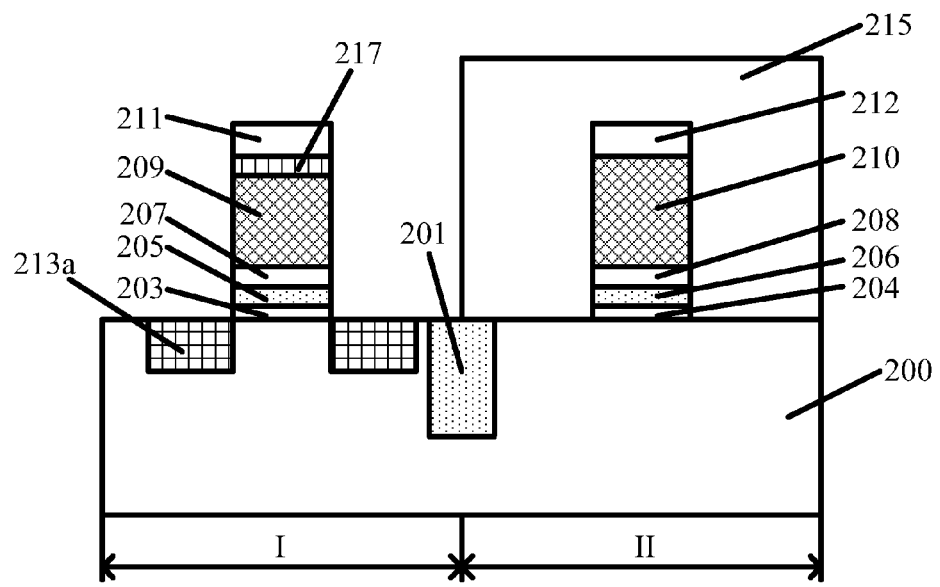

At step S103 of FIG. 1 and referring to FIG. 4, a first amorphous silicon layer 217 can be formed on the first dummy gate 209, e.g., by amorphizing a surface portion of the first dummy gate 209. Because of the protective layer 215, the layers and structures in the second region II can be protected during formation of the first amorphous silicon layer 217.

Amorphous silicon (e.g., the first amorphous silicon layer 217) has better etching selectivity over polysilicon (e.g., the second dummy gate 210). When the second dummy gate 210 is being etched, the first amorphous silicon layer 217 will not be etched and can protect the underlying first dummy gate 209. As such, by forming the first amorphous silicon layer 217, there is no need to form (and later to remove) the conventionally-used photoresist layer to protect the first dummy gate 209 in the first region I. Processing steps, such as CMP or etching steps, can be reduced.

As previously explained, existing methods for forming CMOS devices may include a number of repeating steps including chemical mechanical planarization (CMP) and/or etching steps. The number of repeating steps may lead to size errors of the formed CMOS devices, e.g., having metal gate with an undesired reduced height. The formed CMOS devices may not be stably operated. As disclosed herein, when the repeating steps are reduced, the resulting CMOS device can have an improved stability.

In various embodiments, the first amorphous silicon layer 217 can be formed by a doping process. For example, suitable dopants such as silicon can be doped into a surface portion of the first dummy gate 209. The doping process can use a doping energy of about 10 keV to about 100 keV, and/or an ion dose of about 3E14 atoms/cm$^2$ to about 2E15 atoms/cm$^2$. The first amorphous silicon layer 217 can have a sufficient thickness to protect the underlying layer(s), e.g., of about 50 Å or greater. In one embodiment, the thickness can range from about 50 Å to about 200 Å.

In one embodiment, while the first amorphous silicon layer 217 is formed by amorphizing a surface portion of the first dummy gate 209 using the doping process such as a silicon implantation process, a second amorphous silicon layer 213a can be formed within the semiconductor substrate 200 on both sides of the dummy gate 209, e.g., by doping silicon atoms. In certain embodiments, the second amorphous silicon layer 213a in the first region I, e.g., for forming NMOS, can correspond to source/drain regions of the exemplary NMOS transistor. The second amorphous silicon layer 213a in the first region I can generate dislocations in a subsequently conducted annealing process to improve carrier mobility in the channel region of the exemplary NMOS transistor. In various embodiments, the second region II, e.g., for forming PMOS region, is not amorphized.

Figure 5:
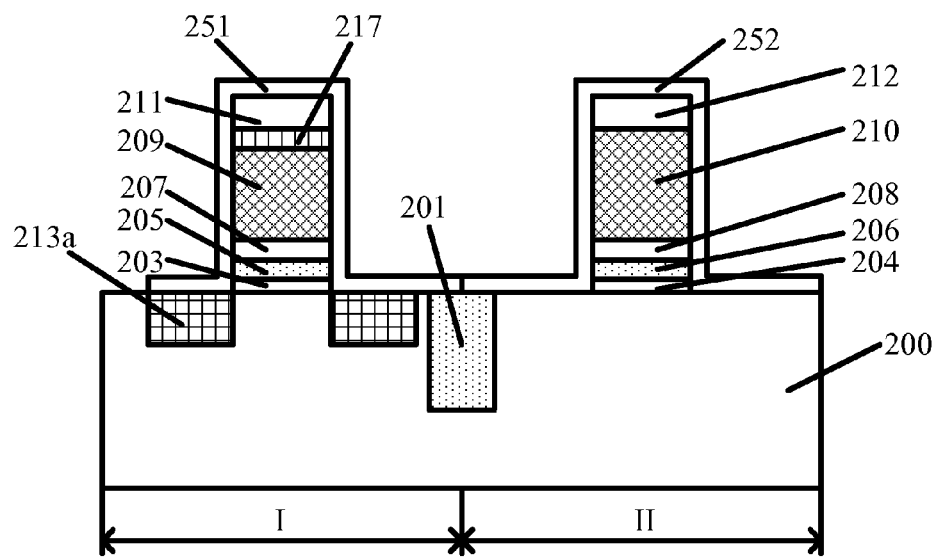

Referring to FIG. 5, after the first amorphous silicon layer 217 in the first region I is formed, the protective layer 215 in the second region II can be removed. The protective layer 215 can be removed by a process including, e.g., an etching process, an ashing process, and/or other appropriate process. A dual contact etch stop layer can then be formed. For example, a first etch stop layer 251 can be formed over surfaces in the first region I, e.g., on the first dummy gate structure including its sidewalls and on a surface portion of the semiconductor substrate 200. Likewise, a second etch stop layer 252 can be formed over surfaces in the second region II, e.g., on the second dummy gate structure including its sidewalls and on a surface portion of the semiconductor substrate 200, as shown in FIG. 5.

In addition to being used to stop an etching process as needed, the first etch stop layer 251 can be used to protect the first amorphous silicon layer 217 and to protect the semiconductor substrate 200 in the first region I. Further, the first etch stop layer 251 can provide tensile stress to the exemplary NMOS transistor and to improve carrier mobility in the channel region of the NMOS transistor. In various embodiments, the first etch stop layer 251 can be made of a material including, for example, silicon nitride ($Si_xN_y$). The first etch stop layer 251 can be formed by, e.g., a plasma deposition using reactive gases. The reactive gases can be a gas mixture including, for example, ammonia, nitrogen, and/or silane. In various embodiments, the gas mixture can include, for example, ammonia of about 10% to about 15% by volume, nitrogen of about 2% to about 6% by volume, and silane of about 79% to about 88% by volume of the total gas mixture. The plasma deposition for forming the first etch stop layer 251 can be conducted, e.g., at a reaction pressure of about 0.08 Pa to about 0.2 Pa, a reaction temperature of about 300° C. to about 400° C., an RF power of about 50 watts to about 100 watts, and/or an RF frequency of about 10 MHz to about 20 MHz. The first etch stop layer 251 formed herein can provide tensile stress to the NMOS transistor.

Similarly, in addition to being used to stop an etching process as needed, the second etch stop layer 252 can be used to protect the second dummy gate 210 and to protect the semiconductor substrate 200 in the second region II. Further, the second etch stop layer 252 can provide tensile stress to the exemplary PMOS transistor and to improve carrier mobility in the channel region of the PMOS transistor. In various embodiments, the second etch stop layer 252 can be made of a material including, for example, silicon nitride ($Si_xN_y$). The second etch stop layer 252 can be formed by, e.g., a plasma deposition using reactive gases. The reactive gases can be a gas mixture including, for example, nitrogen and/or silane. In various embodiments, the gas mixture can include, for example, nitrogen and silane having a volume ratio (nitrogen:silane) of about 0.05 to about 0.2. In one embodiment, the second etch stop layer 252 can be formed having a gas pressure of about 0.08 Pa to about 0.2 Pa, a reaction temperature of about 300° C. to about 400° C., an RF power of about 50 watts to about 100 watts, and/or an RF frequency of about 40 kHz to about 100 kHz. The second etch stop layer 252 formed herein can provide tensile stress to the PMOS transistor.

In other embodiments, the first etch stop layer 251 and the second etch stop layer 252 can be formed using the same material and/or same deposition process, where the first and second etch stop layers 251 and 252 are used as an etch stop layer in the first region I and the second region II, respectively.

Alternatively or optionally, the first hard mask layer 211 (and/or the second hard mask layer 212) can be removed from the first dummy gate 209 (and/or the second dummy gate 210), prior to forming the first etch stop layer 251 (and/or the second etch stop layer 252). The first etch stop layer 251 (and/or the second etch stop layer 252) can then be formed on the first dummy gate 209 (and/or the second dummy gate 210).

Figure 6:
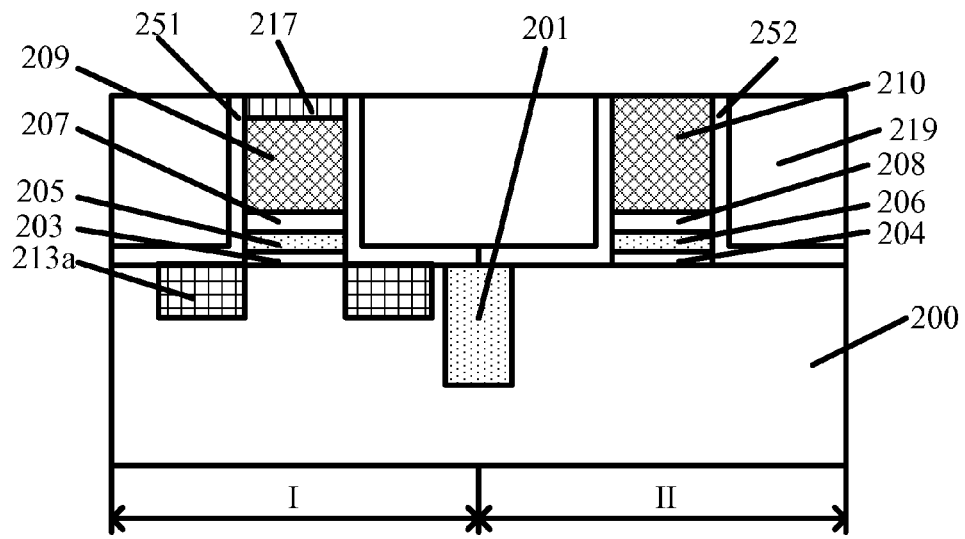

At step S105 of FIG. 1 and referring to FIG. 6, an interlayer dielectric layer (IDL) 219 can be formed by first depositing a corresponding dielectric film on the entire surface of the structure shown in FIG. 5, i.e., on the exposed surface of the semiconductor substrate 200 between the first and second etch stop layers 251 and 252, as well as on surfaces of the first and second etch stop layers 251 and 252. This can be followed by, e.g., a surface planarization process, such as a CMP process, to remove the first and second hard mask layers 211 and 212 and their associated portion of the first and second etch stop layers 251 and 252 and to remove a top portion of the dielectric film, such that the first amorphous silicon layer 217 and a second dummy gate 210 can be exposed, as shown in FIG. 6.

The interlayer dielectric layer (IDL) 219 can be used to isolate, e.g., gates of adjacent transistors. The interlayer dielectric layer 219 can be made of materials including, but not limited to, silicon oxide, silicon nitride, and/or silicon oxynitride. In one embodiment, the interlayer dielectric layer 219 can be made of silicon oxynitride.

Figure 7:
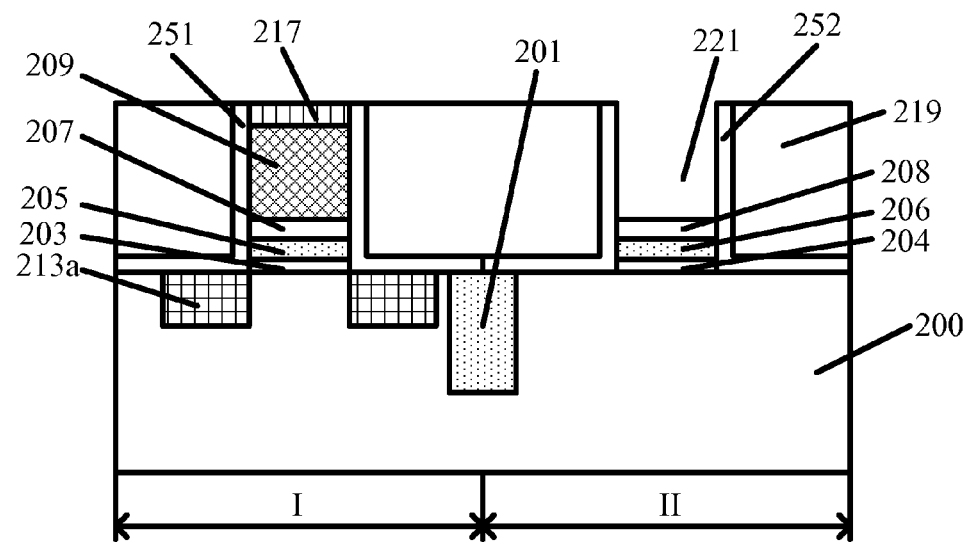

At step S107 of FIG. 1 and referring to FIG. 7, following formation of the interlayer dielectric layer 219, the second dummy gate 210 can be removed, e.g., by a wet etching process, to form a second opening 221. The first amorphous silicon layer 217 can be used as a protective layer, when the second dummy gate 210 is being removed.

The second dummy gate 210 can be removed by an etching process, such as a wet etching process. The exemplary wet etching process can use chemical reagent(s) including, e.g., tetramethylammonium hydroxide (TMAH or TMAOH) and/or ammonia ($NH_3.H_2O$). For example, when TMAH is used, the etching process can be performed at a temperature of about 15° C. to about 70° C. for a time length of about 20 seconds to about 500 seconds. As the second dummy gate 210 is removed, the second opening 221 can be formed in the second region II. In one example, the second opening 221 can include a bottom formed by the second work function metal layer 208 with sidewalls formed by the second etch stop layer 252. In other words, the second work function metal layer 208 can be exposed by the second opening 221.

In another example, the second opening 221 can be formed by first etching the second dummy gate 210 and the underlying layers to the semiconductor substrate 200 to expose the semiconductor substrate 200. One or more layers of a second interface layer 204, a second high-k dielectric layer 206, and/or a second work function metal layer 208 can then be formed in the second opening 221 on the exposed semiconductor substrate 200. In this case, when a metal gate (e.g., a second metal gate 223 in FIG. 8) is subsequently formed in the second opening 221, the gate structure can include at least the second high-k dielectric layer 206 and the subsequently-formed metal gate over the second high-k gate dielectric layer 206. Further, because the first dummy gate 209 is protected by the first amorphous silicon layer 217, a protective layer, such as a photoresist layer, may be unnecessary during the etching process to form the second opening 221.

Figure 8:
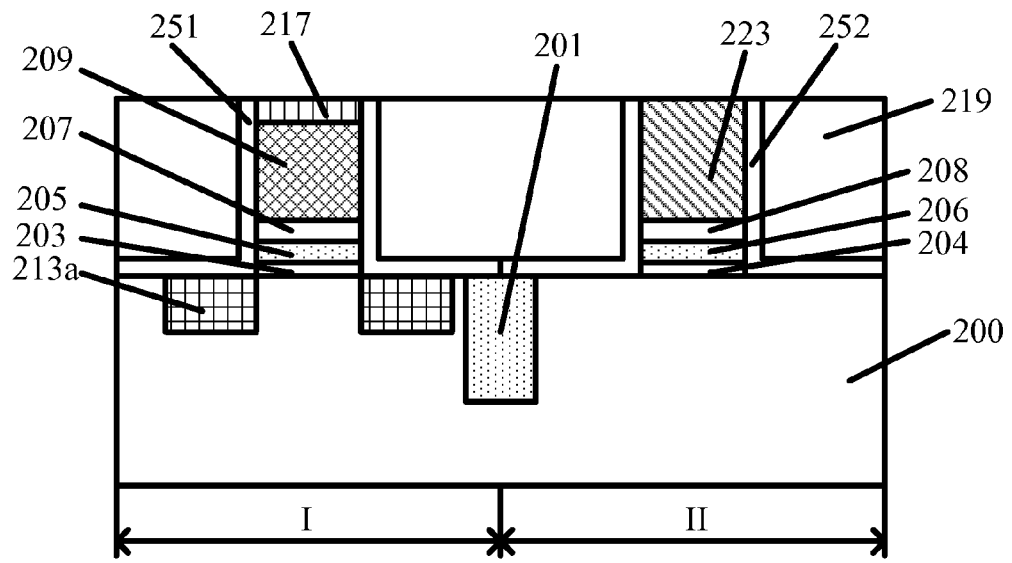

At step S109 of FIG. 1 and referring to FIG. 8, a second metal gate 223 can be formed in the second opening 221 for the exemplary PMOS transistor. The second metal gate 223 can be formed by a deposition process including, for example, a physical or a chemical vapor deposition. In a certain embodiment, the second metal gate 223 can be formed by the chemical vapor deposition including, for example, forming a corresponding second metal gate film (not shown) over the entire surface of the device shown in FIG. 7. That is, the second metal gate film can cover the interlayer dielectric layer 219, the first amorphous silicon layer 217, and the second opening 221. A polishing or planarization process, such as a CMP process, can be performed to polish or planarize the formed second metal gate film until the portion of the second metal gate film in the second opening 221 (e.g., which forms the second metal gate 223), has a surface flush with the surface of the interlayer dielectric layer 219 and the first amorphous silicon layer 217.

The second metal gate 223 can be a single layer or a multilayer formed by stacked layers. The second metal gate 223 can be made of a material including, but not limited to, aluminum (Al), copper (Cu), silver (Ag), tungsten (W), and/or a combination thereof. In one embodiment, the second metal gate 223 can be a single layer made of aluminum. The second metal gate 223 can be a gate electrode of the exemplary PMOS transistor.

In various embodiments, after forming the first dummy gate 209 but prior to forming the first metal gate, a first source/drain region may be formed in the semiconductor substrate 200 on both sides of the first dummy gate. Likewise, following formation of the second dummy gate 210 but prior to forming the second metal gate, a second source/drain region (not illustrated) may be formed in the semiconductor substrate 200 on both sides of the second dummy gate. The first source/drain regions can be doped by n-type ions, the second source/drain regions can be doped by p-type ions. In various embodiments, the first source/drain regions can be located corresponding to the regions of the second amorphous silicon layer 213a in the first region I.

Figure 9:
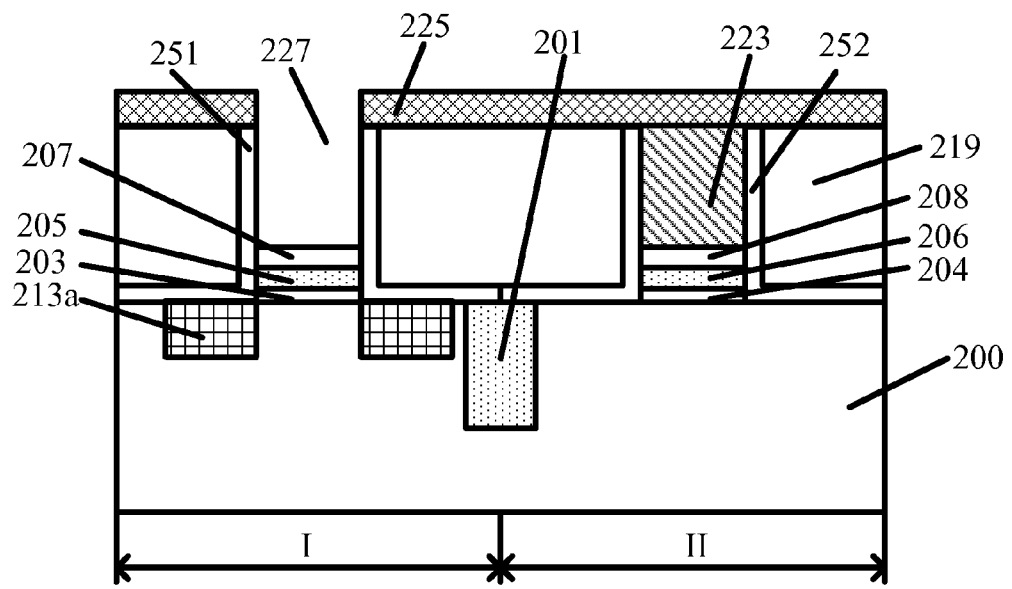

At step S111 of FIG. 1 and referring to FIG. 9, following formation of the second metal gate 223 in the second region II, a first opening 227 can be formed in the first region I by removing the first amorphous silicon layer 217 and the underlying dummy gate 209. Such removal can be conducted by a standard photolithographic process, followed by an etching process using a photoresist layer 225 as an etch mask. The etching process can be, for example, an isotropic dry etch using an etching gas of $CF_4$ to remove the first amorphous silicon layer 217 and the underlying first dummy gate 209. In embodiments, following formation of the first opening 227, the photoresist layer 225 can be removed by, e.g., an etching process, an ashing process, and/or other possible process The first opening 227 can expose the first work function metal layer 207 for a subsequent formation of a first metal gate on the first work function metal layer 207 in the first opening 227. In other embodiments, the first opening 227 can expose the semiconductor substrate 200. One or more of a first interface layer 203, a first high-k dielectric layer 205 and/or a first work function metal layer 207 can then be formed on the exposed surface of the semiconductor substrate 200, followed by forming the first metal gate in the first opening. In this case, the first gate structure can include at least the subsequently-formed metal gate over the first high-k dielectric layer 205. The first gate structure may further include the first interface layer 203 and/or the first work function metal layer 207.

Figure 10:
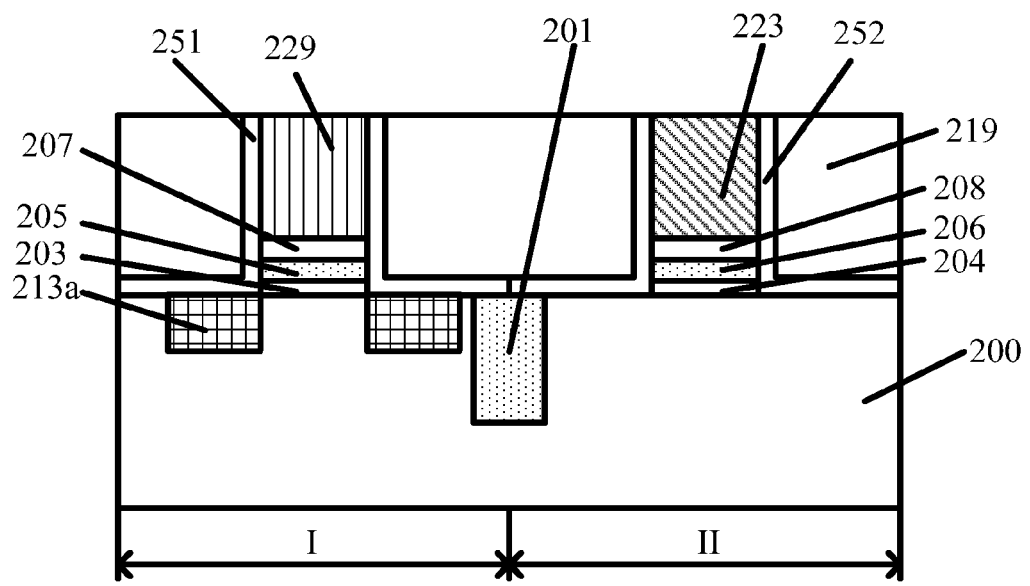

At step S113 of FIG. 1 and referring to FIG. 10, a first metal gate 229 can be formed in the first opening 227 for the exemplary NMOS transistor. The first metal gate 229 can be formed by a deposition process, e.g., a physical or chemical vapor deposition. In one embodiment, the first metal gate 229 can be formed by a chemical vapor deposition including, for example, forming a corresponding first metal gate film (not illustrated) on the entire surface shown in FIG. 9, e.g., to cover the first opening 227, the interlayer dielectric layer 219, and/or the second metal gate 223. This can be followed by a planarization process, such as a CMP process, to planarize the formed first metal gate film until the portion of the second metal gate film in the first opening 227 (e.g., which forms the first metal gate 229), has a surface flush with a surface of the interlayer dielectric layer 219 and the second metal gate 223.

The first metal gate 229 can be a single layer or a multilayer formed by stacked layers. The first metal gate 229 can be made of a material including, but not limited to, aluminum (Al), copper (Cu), silver (Ag), tungsten (W), and/or a combination thereof. In one embodiment, the first metal gate 229 can be a single layer made of aluminum.

Figure 11:
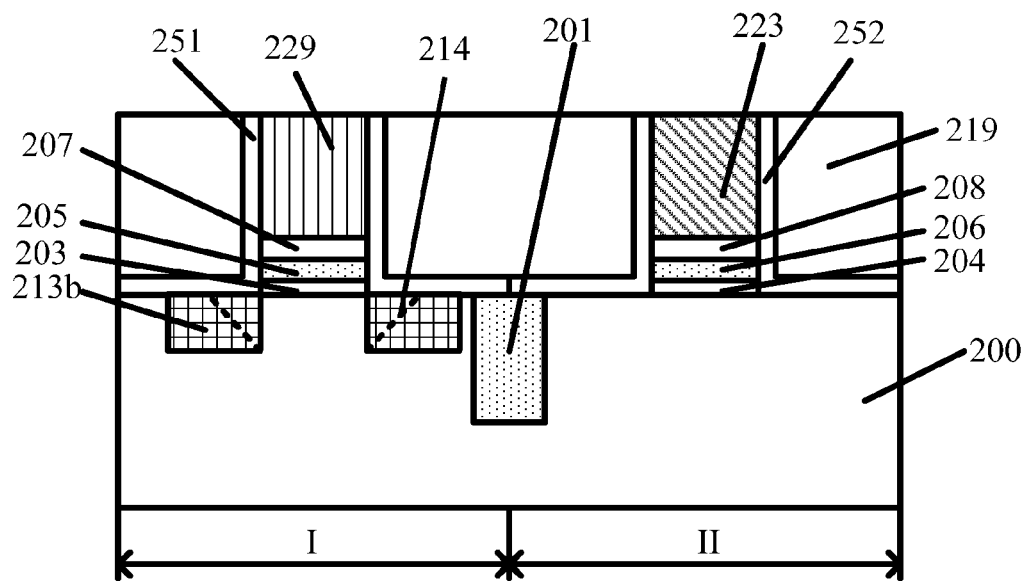

Referring to FIG. 11, the second amorphous silicon layer 213a in the first region I can be annealed to form a dislocation-containing single crystalline silicon layer 213b. This annealing process can allow silicon in the second amorphous silicon layer 213a to regrown. In addition, under the tensile stress of the first etch stop layer 251, silicon atoms in the second amorphous silicon layer 213a can generate edge dislocations to form a dislocation interface, for example, along a dotted line 214 as shown in FIG. 11, to form the dislocation-containing single crystalline silicon layer 213b. The channel region stress and carrier mobility in the exemplary NMOS transistor can be improved. Device performance can be improved.

In exemplary embodiments, the annealing process can use an annealing gas including, for example, helium, nitrogen, ammonia, hydrogen, and/or deuterium. In a certain embodiment, the annealing gas can be hydrogen.

When the second amorphous silicon layer 213a is annealed at a temperature of about 500° C. to about 700° C. for an annealing time of about 10 minutes to about 60 minutes, edge dislocations can be formed to have a dislocation interface along the dashed line 214 shown in FIG. 11. The dislocation interface may have an angle made with the surface of the semiconductor substrate 200 of about 30 degrees to about 60 degrees. The formation of such edge dislocations can improve or maximize channel region carrier mobility of the NMOS transistor.

In other embodiments, the annealing process of the second amorphous silicon layer 213a can be conducted after the removal of the second dummy gate 210 (i.e., the formation of the second opening 221) and prior to forming one or more of the second metal gate 223, the first opening 227, and/or the first metal gate 229.

In still other embodiments, the exemplary PMOS transistor in the second region II can be treated by a stress engineering process. The stress engineering process can include, e.g., forming a silicon recess in the source/drain regions (not illustrated) of the PMOS transistor, followed by selectively and epitaxially forming SiGe in the recessed area of the PMOS transistor.

In this manner, as disclosed herein, the first amorphous silicon layer can be formed to protect the underlying first dummy gate structure in the first region I, when the second dummy gate structure in the second region II is being processed. This is because wet etching of the second dummy gate has high selectivity over the first amorphous silicon layer. Conventionally-used photoresist protective layer can thus be eliminated to simplify the process. The formed CMOS device can have operational characteristics.

While the first amorphous silicon layer is formed on the first dummy gate structure, the second amorphous silicon layer can be formed in the semiconductor substrate on both sides of the first dummy gate structure for forming the exemplary NMOS transistor. After the second dummy gate in the second region II has been removed, the second amorphous silicon layer in the semiconductor substrate in the first region I can be annealed to form a dislocation-containing single crystal silicon layer to improve channel region stress, carrier mobility, and device performance of the exemplary NMOS transistor.

Other applications, advantages, alternations, modifications, or equivalents to the disclosed embodiments are obvious to those skilled in the art.

What is claimed is:

1. A method of forming a complementary metal-oxide-semiconductor (CMOS) device comprising:
   providing a semiconductor substrate including a first region and a second region;
   providing a first dummy gate structure including a first dummy gate over the semiconductor substrate in the first region and a second dummy gate structure including a second dummy gate over the semiconductor substrate in the second region;

amorphizing a surface portion of the first dummy gate to form a first amorphous silicon layer on the first dummy gate;

forming an interlayer dielectric layer on the semiconductor substrate, wherein the first amorphous silicon layer and the second dummy gate are exposed;

wet etching the second dummy gate to form a second opening, while the first amorphous silicon layer protects the first dummy gate without forming a photoresist protective layer;

forming a second metal gate in the second opening;

removing the first amorphous silicon layer and the first dummy gate to form a first opening; and forming a first metal gate in the first opening.

2. The method of claim 1, further including amorphizing a source region and a drain region in the first region of the semiconductor substrate to form a second amorphous silicon layer, while amorphizing the surface portion of the first dummy gate.

3. The method of claim 2, further including annealing the second amorphous silicon layer in the first region of the semiconductor substrate to form a dislocation-containing single crystalline silicon layer.

4. The method of claim 2, further including annealing the second amorphous silicon layer after forming the second opening, wherein an annealing gas including helium, nitrogen, ammonia, hydrogen, or deuterium is used.

5. The method of claim 3, wherein the annealing of the second amorphous silicon layer is at a temperature of about 500° C. to about 700° C. for about 10 minutes to about 60 minutes.

6. The method of claim 3, wherein the dislocation-containing single crystalline silicon layer includes a dislocation interface having an angle with a surface of the semiconductor substrate of about 30 degrees to about 60 degrees.

7. The method of claim 1, wherein the amorphizing of the surface portion of the first dummy gate includes an ion doping process using a doping energy of about 10 keV to about 100 keV and an ion dose of about 3E14 atoms/cm$^2$ to about 2E15 atoms/cm$^2$.

8. The method of claim 1, wherein the first amorphous silicon layer has a thickness of about 50 Å to about 200 Å.

9. The method of claim 1, wherein the wet etching uses a chemical agent including tetramethylammonium hydroxide or ammonia.

10. The method of claim 1, wherein the wet etching uses tetramethylammonium hydroxide at a temperature of about 15° C. to about 70° C. for about 20 seconds to about 500 seconds.

11. The method of claim 1, further including:

forming a first etch stop layer on the first region of the semiconductor substrate, the first etch stop layer covering at least a sidewall of the first dummy gate structure; and forming a second etch stop layer on the second region of the semiconductor substrate, the second etch stop layer covering at least a sidewall of the second dummy gate structure.

12. The method of claim 11, wherein the first etch stop layer is formed by a plasma deposition using a reaction gas including ammonia, nitrogen and silane.

13. The method of claim 12, wherein the ammonia is from about 10% to about 15%, the nitrogen is from about 2% to about 6%, and the silane is from about 79% to about 88% by volume of the total reaction gas.

14. The method of claim 12, wherein the plasma deposition uses a reaction pressure ranging from about 0.08 Pa to about 0.2 Pa at a reaction temperature ranging from about 300° C. to about 400° C., an RF power of about 50 watts to about 100 watts, or an RF frequency of about 10 MHz to about 20 MHz.

15. The method of claim 11, wherein the second etch stop layer is formed by a plasma deposition using a reaction gas including nitrogen and silane.

16. The method of claim 15, wherein the plasma deposition uses a volume ratio of nitrogen to silane ranging from about 0.05 to about 0.2, a reaction pressure ranging from about 0.08 Pa to about 0.2 Pa, a reaction temperature ranging from about 300° C. to about 400° C., an RF power ranging from about 50 watts to about 100 watts, or an RF frequency ranging from about 40 kHz to about 100 kHz.

* * * * *